United States Patent
Yoneyama et al.

(10) Patent No.: US 9,252,087 B2
(45) Date of Patent: Feb. 2, 2016

(54) ELECTRONIC CIRCUIT, PRODUCTION METHOD THEREOF, AND ELECTRONIC COMPONENT

(71) Applicant: MITSUBISHI ELECTRIC CORPORATION, Tokyo (JP)

(72) Inventors: Rei Yoneyama, Tokyo (JP); Nobuya Nishida, Tokyo (JP); Hiroyuki Okabe, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/951,324

(22) Filed: Jul. 25, 2013

(65) Prior Publication Data
US 2014/0138706 A1    May 22, 2014

(30) Foreign Application Priority Data
Nov. 19, 2012 (JP) ................................. 2012-252857

(51) Int. Cl.
*H01L 23/495* (2006.01)
*H01L 23/053* (2006.01)
(Continued)

(52) U.S. Cl.
CPC ........ *H01L 23/49503* (2013.01); *H01L 21/563* (2013.01); *H01L 23/053* (2013.01); *H01L 23/13* (2013.01); *H01L 23/3735* (2013.01); *H01L 23/49833* (2013.01); *H01L 24/32* (2013.01); *H01L 24/73* (2013.01); *H01L 23/24* (2013.01); *H01L 24/83* (2013.01); *H01L 2224/0603* (2013.01); *H01L 2224/06152* (2013.01); *H01L 2224/06154* (2013.01);
(Continued)

(58) Field of Classification Search
CPC .................................. H01L 23/49503
USPC ....................................... 257/676
See application file for complete search history.

(56) References Cited

U.S. PATENT DOCUMENTS 6,147,311 A    11/2000  Higashi
6,225,703 B1   5/2001   Umehara et al.
(Continued)

FOREIGN PATENT DOCUMENTS

JP    63-169096 A    7/1988
JP    63169096 A     7/1988
(Continued)

OTHER PUBLICATIONS

An Office Action issued by the German Patent Office on Aug. 18, 2014, which corresponds to German Patent Application No. 10 2013 214 730.9 and is related to U.S. Appl. No. 13/951,324; with English language translation.
(Continued)

*Primary Examiner* — Ajay K Arora
(74) *Attorney, Agent, or Firm* — Studebaker & Brackett PC

(57) ABSTRACT

An electronic circuit according to this invention includes a printed circuit board and an electronic component that is soldered onto the printed circuit board. The electronic component is a flat package including a die pad exposed to outside and external electrode terminals. A gap is provided between the printed circuit board and the electronic component. The printed circuit board is provided with a hole between the die pad and the external electrode terminals in planar view. The gap is filled with insulating resin at least partially between the die pad and the external electrode terminals. The insulating resin is injected through the hole.

9 Claims, 5 Drawing Sheets

(51) Int. Cl.
*H01L 21/56* (2006.01)
*H01L 23/13* (2006.01)
*H01L 23/373* (2006.01)
*H01L 23/498* (2006.01)
*H01L 23/00* (2006.01)
*H01L 23/24* (2006.01)

(52) U.S. Cl.
CPC ............. *H01L 2224/131* (2013.01); *H01L 2224/13013* (2013.01); *H01L 2224/1403* (2013.01); *H01L 2224/14152* (2013.01); *H01L 2224/16238* (2013.01); *H01L 2224/2919* (2013.01); *H01L 2224/3224* (2013.01); *H01L 2224/32057* (2013.01); *H01L 2224/32225* (2013.01); *H01L 2224/73203* (2013.01); *H01L 2224/83104* (2013.01); *H01L 2224/92125* (2013.01); *H01L 2924/15151* (2013.01)

(56) References Cited

U.S. PATENT DOCUMENTS

| | | |
|---|---|---|
| 6,331,679 B1 | 12/2001 | Higashi |
| 6,544,428 B1 | 4/2003 | Higashi |
| 8,273,607 B2 | 9/2012 | Park et al. |
| 2002/0027276 A1* | 3/2002 | Sakamoto et al. ............ 257/690 |
| 2007/0040186 A1* | 2/2007 | Fillion et al. ................. 257/177 |
| 2007/0138610 A1* | 6/2007 | Krishnan et al. ............. 257/676 |
| 2010/0078783 A1* | 4/2010 | Otremba ...................... 257/676 |
| 2011/0312133 A1* | 12/2011 | Park et al. .................... 438/122 |
| 2012/0043660 A1* | 2/2012 | Poddar et al. ................ 257/773 |

FOREIGN PATENT DOCUMENTS

| | | |
|---|---|---|
| JP | H10-056099 A | 2/1998 |
| JP | 11-102797 A | 4/1999 |
| JP | 2000-031343 A | 1/2000 |
| JP | 2000-244077 A | 9/2000 |
| JP | 2009-164430 A | 7/2009 |
| JP | 2009-290011 A | 12/2009 |

OTHER PUBLICATIONS

An Office Action, "Notification of Reason(s) for Refusal," issued by the Japanese Patent Office on Mar. 31, 2015, which corresponds to Japanese Patent Application No. 2012-252857 and is related to U.S. Appl. No. 13/951,324; with English language partial translation.

An Office Action; "Decision of Refusal," issued by the Japanese Patent Office on Jul. 14, 2015, which corresponds to Japanese Patent Application No. 2012-252857 and is related to U.S. Appl. No. 13/951,324; with English language partial translation.

* cited by examiner

F I G . 2
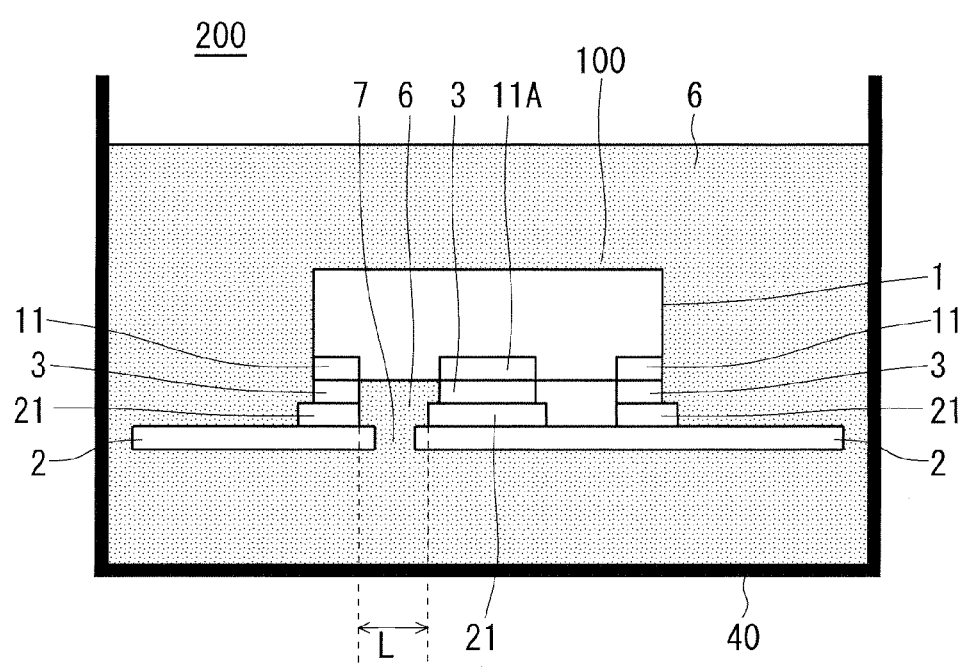

ELECTRONIC CIRCUIT, PRODUCTION METHOD THEREOF, AND ELECTRONIC COMPONENT

BACKGROUND OF THE INVENTION

1. Field of the Invention

The present invention relates to an electronic circuit provided with a surface mount device, a production method thereof, and the surface mount device.

2. Description of the Background Art

Upon mounting a surface mount device on a printed circuit board, if there is a difference in potential between external electrode terminals of the surface mount device, an appropriate insulation distance is conventionally kept between the external electrode terminals in accordance with the difference in potential for the purpose of insulation.

If such insulation by means of air is insufficient, insulation is improved by injecting insulating resin between the external electrode terminals (Japanese Patent Application Laid-Open No. 2000-244077 (Page 5 and FIG. 3), for example).

It is possible to shorten the insulation distance by insulating the external electrode terminals from each other not by air but by resin in the surface mount device, as described above. This is preferred in terms of reduction in size of the surface mount device. However, in general, the gap between the external electrode terminals is too narrow to easily inject resin in some cases.

SUMMARY OF THE INVENTION

It is an object of the present invention to provide an electronic circuit including an electronic component that has a shorter insulation distance between external electrode terminals, a production method thereof, and such an electronic component that has a shorter insulation distance between the external electrode terminals.

An electronic circuit according to the present invention includes a printed circuit board and an electronic component soldered onto the printed circuit board. The electronic component is a flat package including a die pad exposed to outside and an external electrode terminal. The printed circuit board and the electronic component form a gap therebetween, and the printed circuit board is provided with a hole between the die pad and the external electrode terminal in planar view. The gap is filled with insulating resin at least partially between the die pad and the external electrode terminal, and the insulating resin is injected through the hole.

According to the present invention, the insulating resin is injected through the hole provided in the printed circuit board, so that the insulating resin reliably fills the gap at least partially between the die pad and the external electrode terminal. This leads to improvement in insulation between the die pad and the external electrode terminal. The electronic component can be thus designed so as to have a shorter insulation distance between the die pad and the external electrode terminal, thereby achieving reduction in size of the electronic component. It is further possible to realize reduction in size of the electronic circuit on which the smaller electronic component is mounted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a sectional view of an electronic circuit according to a second preferred embodiment;

DESCRIPTION OF THE PREFERRED EMBODIMENTS

<Prerequisite Technique>

Figure 6A:
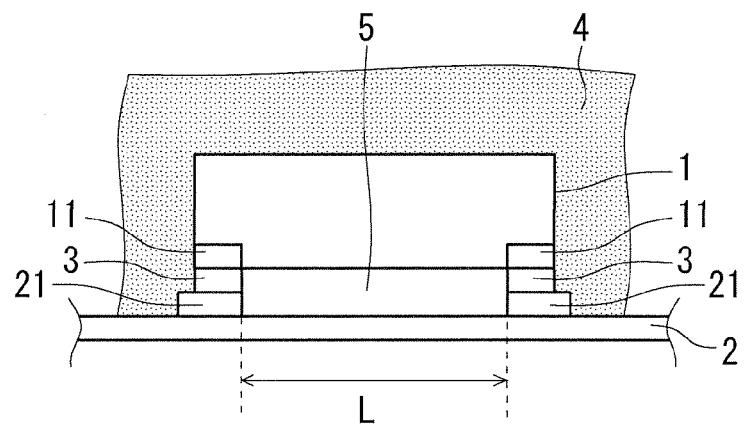
FIGS. 6A and 6B are sectional views of an electronic circuit according to the prerequisite technique.
Figure 6B:
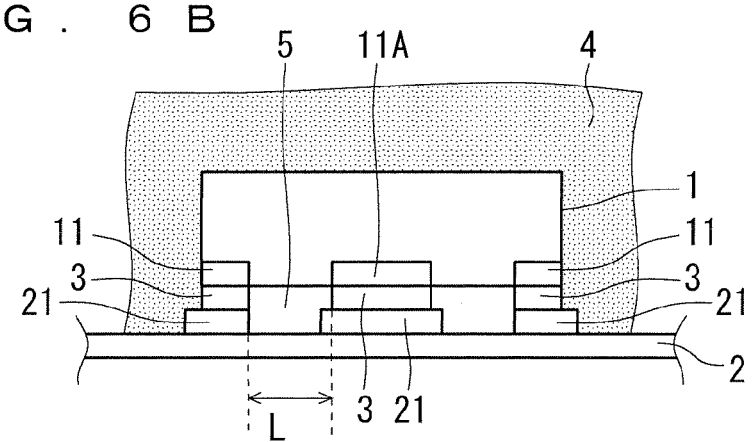

The prerequisite technique of the present invention is described before describing preferred embodiments of the present invention. FIGS. 6A and 6B are sectional views of an electronic circuit according to the prerequisite technique.

FIG. 6A shows the electronic circuit that includes a printed circuit board 2 and an electronic component 1 mounted thereon. The electronic component 1 is a flat package such as a quad flat non-leaded package (QFN) or a small outline non-leaded package (SON).

The electronic component 1 has external electrode terminals 11 that are each soldered to a printed circuit board land 21 provided on the printed circuit board 2 by means of a solder 3. There is provided a gap 5 between the electronic component 1 and the printed circuit board 2.

In general, after the electronic component 1 is mounted on the printed circuit board 2, the electronic component 1 is sealed with insulating resin 4 as shown in FIG. 6A. In terms of insulation, the insulating resin 4 is preferably injected also into the gap 5 between the electronic component 1 and the printed circuit board 2. If the insulating resin 4 is highly viscous, the narrow gap 5 between the electronic component 1 and the printed circuit board 2 occasionally fails to be filled with the insulating resin 4.

In such a case where the gap 5 is not filled with the insulating resin 4, it is necessary to set an insulation distance L between the external electrode terminals 11 of the electronic component 1 in consideration of insulation between the external electrode terminals 11. More specifically, if there is a large difference in potential between the external electrode terminals 11, the electronic component 1 needs to be designed so as to have a long insulation distance L. Such a long insulation distance L leads to increase in size of the electronic component 1, which results in increase in size of the electronic circuit on which the electronic component 1 is mounted.

FIG. 6B exemplifies a case where the electronic component 1 has a die pad 11A that is exposed to outside. Similarly to the external electrode terminals 11, the die pad 11A is soldered to the corresponding printed circuit board land 21. Assume that there is a difference in potential between the external electrode terminal 11 on the left and the die pad 11A in FIG. 6B. In a case where the gap 5 is not filled with the insulating resin 4, it is necessary to design the electronic component 1 in consideration of the insulation distance L in order to secure insulation therebetween. More specifically, if the difference in potential is large between the external electrode terminal 11 and the die pad 11A, the electronic component 1 needs to be designed so as to have a long insulation distance L. Such a long insulation distance L leads to increase in size of the electronic component 1, which results in increase in size of the electronic circuit on which the electronic component 1 is mounted.

<First Preferred Embodiment>
<Structure>

Figure 1A:
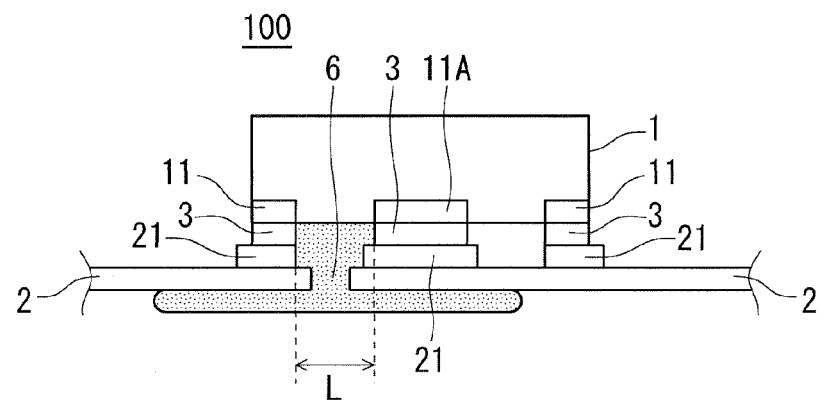
FIGS. 1A to 1C are sectional views and a plan view of an electronic circuit according to a first preferred embodiment.
Figure 1B:
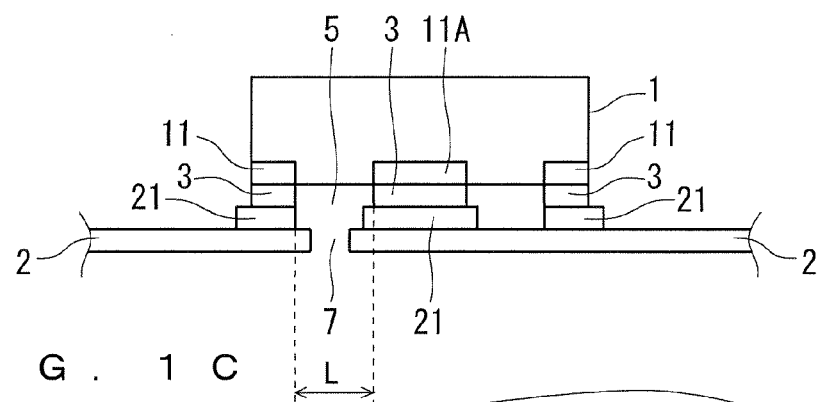

FIG. 1A is a sectional view of an electronic circuit 100 according to the present preferred embodiment. FIG. 1B is a sectional view of the electronic circuit 100 not provided with insulating resin 6 of FIG. 1A. Similarly to the prerequisite technique (FIG. 6B), an electronic component 1 according to the present preferred embodiment is a QFN, a SON, or the like, and includes a die pad 11A exposed to outside and external electrode terminals 11. The electronic component 1 is provided with a SiC semiconductor element or the like as a wide band gap semiconductor.

A printed circuit board 2 is provided with printed circuit board lands 21. The external electrode terminals 11 and the die pad 11A of the electronic component 1 are each soldered to corresponding one of the printed circuit board lands 21 on the printed circuit board 2 by means of a solder 3.

Assume that there is a difference in potential between the external electrode terminal 11 on the left and the die pad 11A in FIGS. 1A and 1B. In this case, as shown in FIG. 1B, the printed circuit board 2 is provided with a hole 7 between the external electrode terminal 11 on the left and the die pad 11A in planar view. There is further provided a gap 5 between the electronic component 1 and the printed circuit board 2.

A method of producing the electronic circuit 100 according to the present preferred embodiment includes the steps of soldering the electronic component 1 to the printed circuit board 2, and subsequently injecting the insulating resin 6 into the gap 5 through the hole 7 provided in the printed circuit board 2 from the rear side of the printed circuit board 2. As a result, the gap 5 is filled with the insulating resin 6 and there is achieved the state shown in FIG. 1A.

As shown in FIG. 1A, the rear surface of the printed circuit board 2 can be optionally coated with the insulating resin 6 simultaneously with the injection of the insulating resin 6.

Further optionally, similarly to the prerequisite technique in which the front side of the electronic component 1 is sealed with the insulating resin 4, the front side of the electronic component 1 can be sealed with the insulating resin in the present preferred embodiment.

According to the present preferred embodiment, the die pad 11A and the external electrode terminal 11 are insulated from each other more reliably because the insulating resin 6 fills the gap 5 between the die pad 11A and the external electrode terminal 11 that are different in potential. The electronic component 1 can be thus designed so as to have the insulation distance L between the die pad 11A and the external electrode terminal 11 shorter than that of the prerequisite technique.

According to the present preferred embodiment, the insulating resin 6 completely fills the gap 5 as shown in FIG. 1A. It is most preferred in terms of insulation that the gap 5 is completely filled with the insulating resin 6 in this manner. Even in a case where the gap 5 is filled partially, it is still possible to enhance insulation between the die pad 11A and the external electrode terminal 11 to shorten the insulation distance L because a creeping distance between the die pad 11A and the external electrode terminal 11 can be lengthened.

Figure 1C:
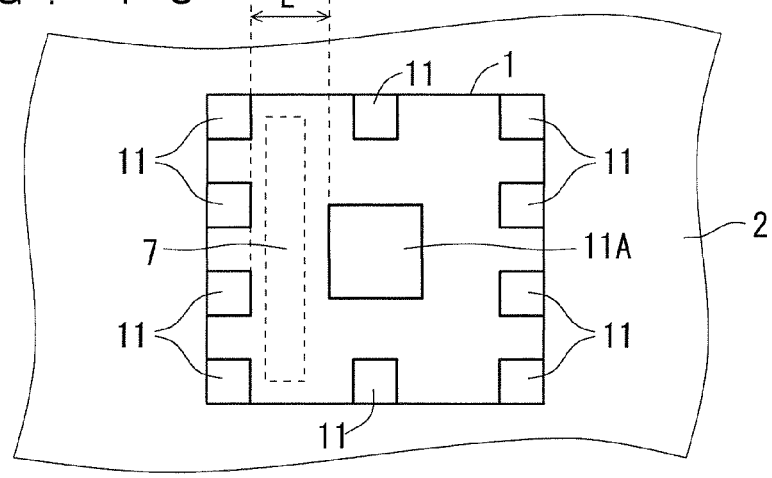

FIG. 1C is an exemplary plan view of the electronic circuit 100 according to the present preferred embodiment. If there is a difference in potential between the arrayed external electrode terminals 11 on the left and the die pad 11A, the hole 7 in a slit shape enables efficient injection of the insulating resin 6 between the arrayed external electrode terminals 11 on the left and the die pad 11A.

The electronic component 1 according to the present preferred embodiment is provided with the SiC semiconductor element as the wide band gap semiconductor element. Alternatively, the SiC semiconductor element can be replaced with a GaN semiconductor element or the like.

<Effects>

The electronic circuit 100 according to the present preferred embodiment includes the printed circuit board 2 and the electronic component 1 that is soldered onto the printed circuit board 2. The electronic component 1 is a flat package including the die pad 11A exposed to outside and the external electrode terminals 11. The gap 5 is provided between the printed circuit board 2 and the electronic component 1. The printed circuit board 2 is provided with the hole 7 between the die pad 11A and the external electrode terminals 11 in planar view. The gap 5 is filled with the insulating resin 6 at least partially between the die pad 11A and the external electrode terminals 11. The insulating resin 6 is injected through the hole 7.

The insulating resin 6 injected through the hole 7 provided in the printed circuit board 2 reliably fills the gap 5 at least partially between the die pad 11A and the external electrode terminals 11, thereby improving insulation between the die pad 11A and the external electrode terminals 11. The electronic component 1 can be thus designed so as to have the insulation distance L between the die pad 11A and the external electrode terminals 11 shorter than that of the prerequisite technique (FIG. 6B). As a result, the electronic component 1 can be reduced in size. Such reduction in size of the electronic component 1 achieves reduction in size of the electronic circuit 100 on which the electronic component 1 is mounted.

In the electronic circuit 100 according to the present preferred embodiment, the electronic component 1 includes the wide band gap semiconductor element.

In general, the wide band gap semiconductor element is used by applying high voltage, so that there is a large difference in potential between the die pad 11A and the external electrode terminals 11. Insulation is significantly improved by the insulating resin 6 filling the gap 5 between the die pad 11A and the external electrode terminals 11 that are largely different in potential from the die pad 11A. As a result, it is possible to shorten the insulation distance L particularly effectively.

The method of producing the electronic circuit 100 according to the present preferred embodiment includes the steps of soldering the electronic component 1 to the printed circuit board 2 provided with the hole 7, and subsequently injecting the insulating resin 6 through the hole 7.

The gap 5 can be easily filled with the insulating resin 6 that is injected into the gap 5 through the hole 7 provided in the printed circuit board 2.

<Second Preferred Embodiment>

FIG. 2 is a sectional view of an electronic circuit 200 according to the present preferred embodiment. In the electronic circuit 200 according to the present preferred embodiment, the electronic circuit 100 of the first preferred embodiment is accommodated in a casing 40.

Similarly to the first preferred embodiment, assume that there is a difference in potential between the die pad 11A and the external electrode terminal 11 on the left in FIG. 2 in the present preferred embodiment.

The insulating resin 6 fills the casing 40 and the gap 5 between the electronic circuit 100 and the printed circuit board 2. When producing the electronic circuit 200 according to the present preferred embodiment, in the step of injecting the insulating resin 6 into the casing 40, the insulating resin 6 is simultaneously injected into the gap 5 in the electronic circuit 100 through the hole 7.

The electronic circuit 200 according to the present preferred embodiment further includes the casing 40 that accommodates the printed circuit board 2 and the electronic component 1, and the casing 40 is filled with the insulating resin 6.

When filling the insulating resin 6 into the casing 40, the gap 5 in the electronic circuit 100 accommodated in the casing 40 is simultaneously filled with the insulating resin 6 through the hole 7. In this case where the electronic circuit 100 is accommodated in the casing 40, it is possible to simplify the step of sealing with resin.

<Third Preferred Embodiment>

Figure 3:
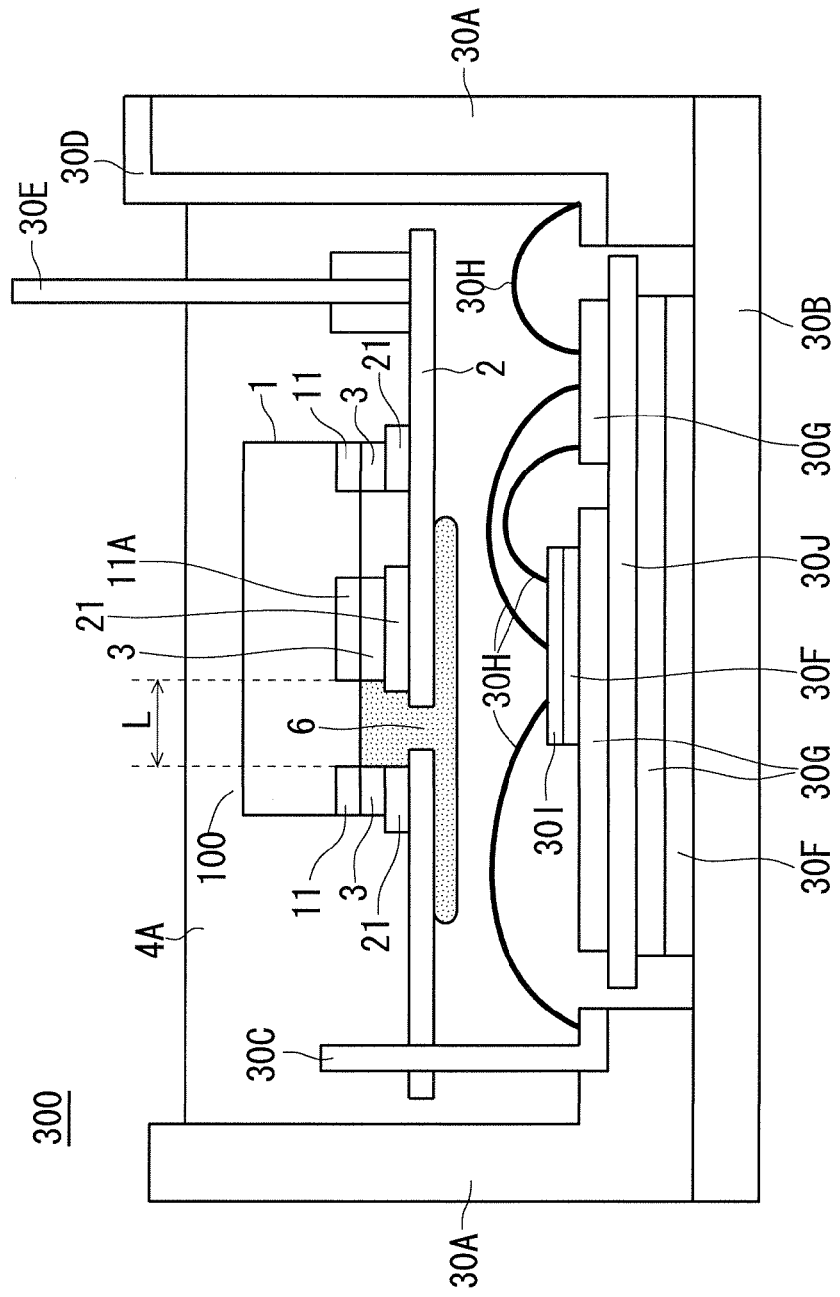
FIG. 3 is sectional view of an electronic circuit according to a third preferred embodiment.

FIG. 3 is a sectional view of an electronic circuit 300 according to the present preferred embodiment. The electronic circuit 300 according to the present preferred embodiment includes the electronic circuit 100 of the first preferred embodiment and a semiconductor module that is electrically connected with the electronic circuit 100. The semiconductor module is provided with a SiC semiconductor element or the like as a power semiconductor element 30I.

The configuration of the semiconductor module is described firstly. The semiconductor module has a casing that includes a case 30A and a base plate 30B. The case 30A is integrally provided with a joint terminal 30C and a power terminal 30D. Alternatively, the joint terminal 30C and the power terminal 30D are buried in the case 30A.

The base plate 30B is provided thereon with an insulating substrate 30J that is joined to the base plate 30B by a solder 30F. The insulating substrate 30J is provided on both surfaces with wiring patterns 30G. The insulating substrate 30J is provided with the SiC semiconductor element that is joined thereonto by means of a solder 30F.

The electronic circuit is accommodated in the casing of the semiconductor module. A printed circuit board 2 of the electronic circuit 100 and the power semiconductor element 30I are connected with each other by way of the joint terminal 30C and a wire 30H. The printed circuit board 2 of the electronic circuit 100 is provided with an interface terminal 30E.

The power semiconductor element 30I and the power terminal are connected with each other by wires 30H by way of the wiring pattern 30G.

The case 30A of the semiconductor module is filled with silicone gel 4A or the like.

The electronic circuit 300 according to the present preferred embodiment includes the electronic circuit 100 that is accommodated in the case 30A of the semiconductor module. The present preferred embodiment is not necessarily limited to this configuration as long as the electronic circuit 100 is electrically connected with the semiconductor module.

<Effects>

The electronic circuit 300 according to the present preferred embodiment further includes the semiconductor module that is electrically connected with the printed circuit board 2 and includes the power semiconductor element 30I.

Even in a case where a difference in potential of the power semiconductor element 30I in the semiconductor module is generated between the die pad 11A and the external electrode terminal 11 on the left in FIG. 3 in the electronic component 1 in the electronic circuit 100, it is possible to shorten the insulation distance L due to the insulating resin 6 filling the gap 5, in comparison to a case where the gap 5 is not filled with the insulating resin 6. The electronic component 1 can be thus reduced in size, which leads to reduction in size of the electronic circuit 100 including the electronic component 1. As a result, it is possible to reduce in size of the electronic circuit 300 that includes the electronic circuit 100. When the electronic circuit 100 is accommodated in the case of the semiconductor module, the semiconductor module itself can be reduced in size.

In the electronic circuit 300 according to the present preferred embodiment, the SiC semiconductor element is provided as the power semiconductor element 30I.

In general, the SiC semiconductor element is used by applying high voltage. It is thus possible to further shorten the insulation distance L in the electronic component 1, which realizes further reduction in size of the electronic circuit 100 and the electronic circuit 300.

<Fourth Preferred Embodiment>

Figure 4A:
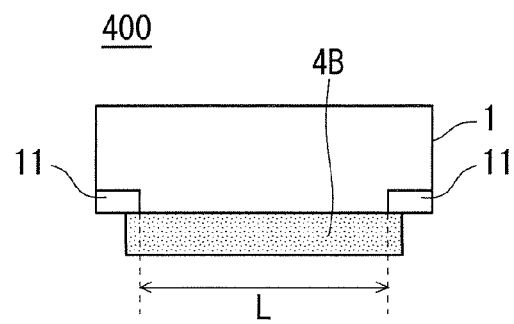
FIGS. 4A and 4B are sectional views of an electronic component and an electronic circuit according to a fourth preferred embodiment.
Figure 4B:
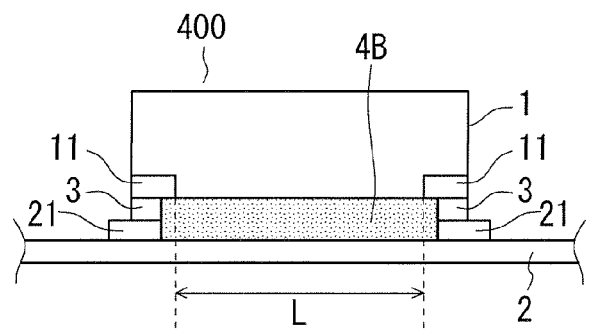

FIG. 4A is a sectional view of an electronic component 400 according to the present preferred embodiment. FIG. 4B is a sectional view of a printed circuit board 2 on which the electronic component 400 of the present preferred embodiment is mounted.

The electronic component 400 according to the present preferred embodiment is a flat package such as a QFN or a SON, and the electronic component 400 is provided with external electrode terminals 11 on a surface of the package.

Assume that there is a difference in potential between the external electrode terminals 11 on the right and left in FIG. 4A. Between the external electrode terminals 11 on the right and left, thermosetting resin 4B is applied onto the surface of the package 1 of the electronic component 400. The thermosetting resin 4B is applied also onto surfaces of the external electrode terminals 11 except for portions joined by solders 3.

The electronic component 400 thus configured is mounted on the printed circuit board 2. The printed circuit board 2 is provided thereon with printed circuit board lands 21. The external electrode terminals 11 and the printed circuit board lands 21 are correspondingly joined to each other by the solders 3. The thermosetting resin 4B is cured by heat treatment for soldering, and a gap between the electronic component 400 and the printed circuit board 2 is filled with the thermosetting resin 4B.

The thermosetting resin 4B fills the gap between the external electrode terminals 11 on the right and left in this manner, thereby improving insulation between these external electrode terminals 11. It is thus possible to shorten an insulation distance L between the external electrode terminals 11, which enables reduction in size of the electronic component 400.

In the present preferred embodiment, the electronic component 1 can have a die pad that is exposed to outside, similarly to the first preferred embodiment. In a case where there is a difference in potential between the external electrode terminals 11 and the die pad, effects similar to those described above can be achieved by applying the thermosetting resin 4B onto the surface of the package 1 of the electronic component 400 between the external electrode terminals 11 and the die pad.

<Effects>

In the electronic component 400 according to the present preferred embodiment, the package 1 is provided on the surface thereof with the plurality of external electrode terminals 11 that are different in potential. The thermosetting resin 4B is provided along the surface of the package 1 between the external electrode terminals 11.

Because of the thermosetting resin 4B applied onto the surface of the package 1 of the electronic component 400 between the external electrode terminals 11 that are different in potential, when the electronic component 400 is mounted on the printed circuit board 2, the thermosetting resin 4B fills the gap between the electronic component 400 and the printed circuit board 2 and between the external electrode terminals 11. This enhances insulation between the external electrode terminals 11 that are different from each other in potential. It is thus possible to shorten the insulation distance L between the external electrode terminals 11 that are different in potential, thereby enabling reduction in size of the electronic component 400. Such reduction in size of the electronic component 400 leads to reduction in size of the printed circuit board 2 on which the electronic component 400 is mounted.

<Fifth Preferred Embodiment>

Figure 5:
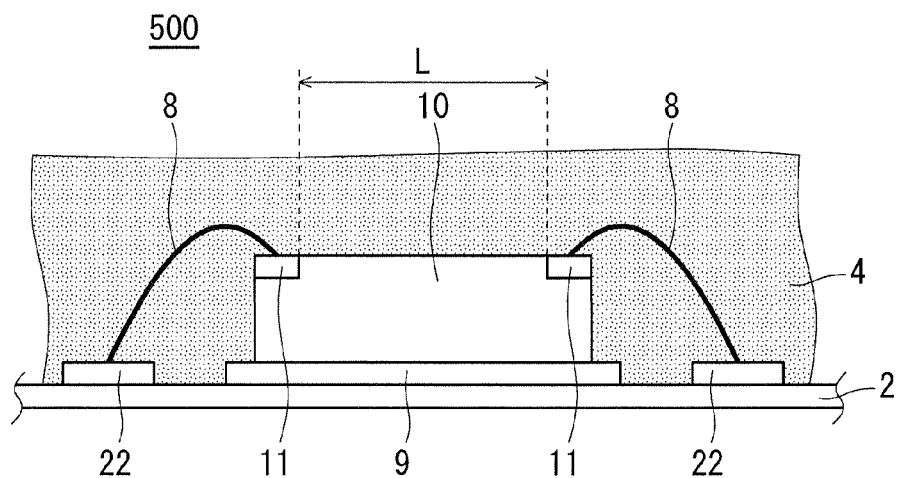
FIG. 5 is a sectional view of an electronic circuit according to a fifth preferred embodiment.

FIG. 5 is a sectional view of an electronic circuit 500 according to the present preferred embodiment. The electronic circuit 500 includes an electronic component 10 that is provided with external electrode terminals 11 on the upper surface of a package, a printed circuit board 2 bonded to the lower surface of the package of the electronic component 10, and wires 8 electrically connecting the external electrode terminals 11 and the printed circuit board 2. The printed circuit board 2 is provided on a surface thereof with wire pads 22.

Assume that the external electrode terminals 11 on the right and left are different from each other in potential in the electronic component 10 shown in FIG. 5.

Described below is, a method of producing the electronic circuit 500. Initially, the surface of the electronic component 10 not provided with the external electrode terminals 11, that is, the lower surface of the package, is bonded to the printed circuit hoard 2 with a bonding portion 9 interposed therebetween. The electronic component 10 is bonded with use of an adhesive agent that is durable against heat generated by the electronic component 10 in operation.

Subsequently, first ends of the wires 8 are soldered correspondingly to the external electrode terminals 11, and second ends of the wires 8 are soldered correspondingly to the wire pads 22, so that the external electrode terminals 11 of the electronic component 10 are electrically connected with the printed circuit board 2. The wires 8 can be made of copper, for example.

Alternatively, the wires 8 can be joined by means of wire bonding. In this case, the wires 8 are made of aluminum or the like, and are joined by ultrasonic waves.

Next, as shown in FIG. 5, the front side of the electronic circuit 500 is sealed with insulating resin 4. More specifically, the insulating resin 4 seals the electronic component 10, the wires 8, the bonding portion 9 between the electronic component 10 and the printed circuit board 2, and the joint portions between the wires 8 and the printed circuit board 2 (namely, the wire pads 22). In the course of these production steps, there is obtained the electronic circuit 500 according to the present preferred embodiment.

In the electronic circuit 500 according to the present preferred embodiment, the insulating resin 4 seals the gap between the external electrode terminals 11 that are different from each other in potential, thereby improving insulation between the external electrode terminals 11. It is thus possible to shorten the insulation distance L between the external electrode terminals 11.

<Effects>

The electronic circuit 500 according to the present preferred embodiment includes the electronic component 10 that is provided on the upper surface of the package with the plurality of external electrode terminals 11 being different in potential, the printed circuit board 2 bonded to the lower surface of the package of the electronic component 10, and the wires 8 electrically connecting the external electrode terminals 11 and the printed circuit board 2. The insulating resin 4 seals the electronic component 10, the wires 8, the bonding portion 9 between the electronic component 10 and the printed circuit board 2, and the joint portions between the wires 8 and the printed circuit board 2 (namely, the wire pads 22).

The external electrode terminals 11 are provided on the upper surface of the package of the electronic component 10. When the electronic component 10 is sealed with the insulating resin 4, the external electrode terminals 11 provided on the upper surface of the package are also sealed with resin. As a result, insulation between the external electrode terminals 11 is improved. In comparison to the prerequisite technique (FIG. 6A) in which the gap between the external electrode terminals 11 is not filled with insulating resin, it is possible to shorten the insulation distance L. This enables reduction in size of the electronic component 10, thereby realizing reduction in size of the electronic circuit 500 on which the electronic component 10 is mounted. Furthermore, the external electrode terminals 11 provided on the upper surface of the package of the electronic component 10 enable check of outer appearance of the joint portions, thereby improving the yield in the production steps.

In the electronic circuit 500 according to the present preferred embodiment, the wires 8 are made of copper are and joined by soldering. The soldering leads to increase in strength of the joint portions.

Alternatively, in the electronic circuit 500 according to the present preferred embodiment, the wires 8 are made of aluminum and joined by ultrasonic waves. Even in a case where the electronic component 10 is small and the external electrode terminals 11 have small joint surfaces, the wires 8 can be joined by wire bonding.

The preferred embodiments of the present inventions can be freely combined together and can be appropriately modified or simplified within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. An electronic circuit comprising:
   a printed circuit board; and
   an electronic component soldered onto said printed circuit board; wherein
   said electronic component is a flat package including a die pad exposed to outside and an external electrode terminal,
   said printed circuit board and said electronic component form a gap therebetween,
   said printed circuit board is provided with a hole between said die pad and said external electrode terminal in planar view, wherein there is no overlapping area between said hole and said die pad in planar view,
   wherein there is no overlapping area between said hole and said external electrode terminal in planar view,
   said gap is filled with insulating resin at least partially between said die pad and said external electrode terminal, and
   said insulating resin is injected through said hole.

2. The electronic circuit according to claim 1, further comprising:
   a casing accommodating said printed circuit board and said electronic component; wherein
   said insulating resin fills said casing.

3. The electronic circuit according to claim 1, wherein said electronic component includes a wide band gap semiconductor element.

4. The electronic circuit according to claim 1, further comprising:
- a semiconductor module electrically connected with said printed circuit board; wherein
- said semiconductor module includes a power semiconductor element.

5. The electronic circuit according to claim 4, wherein
said power semiconductor element includes a SiC semiconductor element.

6. A method of producing the electronic circuit according to claim 1, the method comprising the steps of:
- (a) soldering said electronic component to said printed circuit board provided with said hole; and
- (b) subsequently injecting said insulating resin through said hole.

7. The electronic circuit according to claim 1, wherein said hole has a slit shape.

8. The electronic circuit according to claim 1, wherein said insulating resin is extended to a surface of the printed circuit board.

9. The electronic circuit according to claim 1, wherein said insulating resin is extended through the hole of the printed circuit board to a surface opposite of the electronic component.

* * * * *